United States Patent

Paulke et al.

[11] 4,223,274
[45] Sep. 16, 1980

[54] AMPLIFIER FOR ELECTRICAL SIGNALS

[75] Inventors: Bodo Paulke, Neunkirchen am Brand; Alfred Walz, Burgthann, both of Fed. Rep. of Germany

[73] Assignee: Siemens Aktiengesellschaft, Berlin & Munich, Fed. Rep. of Germany

[21] Appl. No.: 971,030

[22] Filed: Dec. 19, 1978

[30] Foreign Application Priority Data

Jan. 25, 1978 [DE] Fed. Rep. of Germany ....... 2803204

[51] Int. Cl.² ............................................. H03G 3/00
[52] U.S. Cl. .................................. 330/133; 330/134; 330/279
[58] Field of Search ........................ 330/133, 134, 279; 325/404, 405

[56] References Cited

U.S. PATENT DOCUMENTS

| 3,015,076 | 12/1961 | Sheehan | 330/133 X |
| 3,802,776 | 4/1974 | Tehang | 356/41 |

Primary Examiner—James B. Mullins
Attorney, Agent, or Firm—Hill, Van Santen, Steadman, Chiara & Simpson

[57] ABSTRACT

An amplifier is disclosed for electrical signals which consists of a plurality of series-connected amplification stages each of which has at least one voltage-controlled amplifier element whose control characteristic can be adjusted by means of a control signal. An amplification is desirable for all individual stages which is equally great over an arbitrarily preselectable dynamic range. According to the invention, the amplifier has at least one control signal forming element for each of the amplifier elements of each amplification stage which exhibit different control characteristics compared to one another. This control signal forming element forms a secondary control voltage $U_{ST2}$ from a primary control voltage $U_{ST1}$ according to the equation $U_{ST2} = m \cdot U_{ST1} + n$; m and n representing forming magnitudes which can be individually differently adjusted for each amplifier element at the control signal forming element so that differences in the control characteristic courses are compensated for by adjusting to a commonly prescribable characteristic. The amplifier is useful as a depth compensation amplifier in the ultrasonic impulse echo image technique.

8 Claims, 3 Drawing Figures

AMPLIFIER FOR ELECTRICAL SIGNALS

BACKGROUND OF THE INVENTION

The invention relates to an amplifier for electrical signals and which consists of a multiplicity of series-connected amplification stages of which each comprises at least one voltage-controlled amplifier element whose control characteristic can be adjusted by a control signal.

In a chain circuit of voltage-controlled amplification stages the problem occurs that the individual stages—with the same control voltage—can exhibit different amplifications due to production tolerances in the active elements, in particular in those which are equipped with semicondutors. This harbors the danger that during the amplification adjustment one of the first or front end amplification stages of the chain is over excited or over modulated earlier than the subsequent ones when strong input signals are present. The impulse prolongation causes thereby leads to fade-over dissolution of subsequent signals. However, this is generally not recognized as such; rather, the impulse widening is erroneously evaluated as a particularly strong echo. Correspondingly, the operator will further adjust to higher amplification degrees although overamplifications already occurred. The non-recognizance of this overamplification, however, then leads to falsifications of the measuring result. Different overamplifications or over excitations with a subsequent signal fade-over readily occur in such amplifiers, in which a control range of a correspondly broad dynamic response is required on the basis of the broad dynamic range of the incoming useful signals for the purpose of amplitude compensation. Signals with a particularly great dynamic range, for example, occur in the ultrasonic impulse echo-measurement technique. There the specific problem results that after irradiation of a transmitter impulse into an examination object, for example, a human body, in ultrasonic diagnostics, echo impulses of very different intensities occur from the various object layer depths. The larger the penetration depth, the smaller is the intensity of the incoming echo. The dynamic range of the echo signals can therefore extend between zero through 100 dB. It is obvious that with an over excitation or overmodulation of individual amplification stages by means of relatively strong echo impulses, subsequent echo impulses can no longer be detected and displayed. With B-scan, this leads, for example, to errors in the longitudinal resolution. The picture quality of sectional images is strongly decreased. The corresponding also holds true for A-scan or other ultrasonic scanning methods. In spite of reduced picture quality, allowances were made for the possible overamplification of individual amplification stages due to lack of suitable improvement suggestions, particularly because nobody thought of a numeric evaluation of the received echo signals until now. By numeric evaluation in the present case a processing method at the output signal can be generally understood. With the aid of this, conclusions can be drawn from the nature and form of the output signal about the respective properties of the original signal. In ultrasonic-diagnostics, for example, from the light intensity image occurring after the final amplification, conclusions can be drawn for the structure actually present in the examination object, which is only then possible when the properties of the transmission path from the object to the final evaluator are precisely known. Indeed, at least in regard to the disadvantages of over excitation, a sure remedy could have been provided if by active amplifier elements, a correspondingly step-wise higher-stage amplification would have been employed in the amplifier alongside of the chain with increasing amplification stage number. However, this method would have required a cumbersome selection from a production standpoint of active amplifier elements which would have unnecessarily increased the cost of the total equipment. Moreover, in an amplifier thus designed, the amplification of the individual stages would be necessarily different. Such an amplifier would thus be unsuitable for a numeric evaluation in the type described above.

SUMMARY OF THE INVENTION

It is an object of the present invention to design an amplifier such that an over excitation or overamplification behavior with interference effects of the above described type can no longer occur. Rather, even with the broadest dynamic characteristic in the control range, with respect to the amplification behavior of the total amplifier, properly controllable and thus reproducible conditions are to be provided at any time which, for example, also facilitate a numeric evaluation along the above described lines.

The objective is inventively resolved in that one control signal forming element is present for at least each of those amplifier elements of each amplification stage which exhibit different control characteristics $V(U_{ST})$ compared to one another. This control signal forming element forms a secondary control voltage $U_{ST2}$ from a primary control voltage $U_{ST1}$ applied at the output side. The secondary control voltage proceeds specifically according to the equation $$U_{ST2} = mU_{ST1} + n$$

where m and n represent forming magnitudes. These magnitudes can be individually adjusted differently at the control signal forming element for each amplifier element along the lines that differences in the control characteristic curves $V(U_{ST})$ are compensated for by means of adjusting to a commonly prescribed characteristic.

According to the invention, it occurs that the amplification in all individual stages of an applied control voltage across an arbitrarily adjustable dynamic range exhibits the same dependency. Thus, uncontrolled over excitation effects in the individual amplification stages within the total chain can no longer occur since now always the last stage of a chain first delimits the signal so that an over excitation can be directly and unequivocally determined by the operator. Thus, the disadvantages connected therewith can no longer occur. Moreover, on the basis of a jointly prescribed control characteristic for all individual stages, the advantage of an unequivocal reproduction of the input magnitude resuts from the characteristic curve when the output magnitude is known. Thus, the inventive amplifier permits the numeric evaluation along the above lines with the simplest technical means.

According to the invention, a variation of the factor m specifically effects an alteration of the rise of the characteristic curve. Thus, the characteristic is therefore adjusted or pivoted. A variation of the forming magnitude n, however, effects a parallel displacement of the total regulating characteristic. Thus, at least in the linear range of the characteristic, the tolerances of active amplification elements can be compensated for by means of adjustment at two points at least.

The pivoting and also the parallel displacement of a characteristic for the purpose of a congruent conversion of this characteristic into a different characteristic is already known in a different context as described in U.S. Pat. No. 3,802,776 incorporated herein by reference. The subject of this Letters Patent is a photometer for determining the oxygen content of blood, where through the use of oxygen-reduced blood (0% $O_2$), two output characteristics of the received spectral intensity resulting with the irradiation of two different light wavelengths are congruently transferred one into the other in dependence upon the hemoglobin content of the blood. However, this congruent transfer only holds true for the special case of oxygen-reduced blood. It does not hold true, however, for all those intensity signals which occur for blood having an oxygen content different from zero. Therefore, these signals also further exhibit different characteristic curves as they indeed must, since finally the hemoglobin content of the blood is to be detected from its deviation from the 0% $O_2$-characteristics which specifically always remains constant for the wavelength 805 nm. Thus, in the photometer according to the U.S. Pat. No. 3,802,776, a zero normal for the oxygen characteristic curve is provided by means of the transfer of a zero-characteristic for the oxygen content, which is first dependent upon the hemoglobin content of the blood, into such a zero-characteristic which is not dependent upon the hemoglobin content.

The transfer alignment (zero alignment) proceeds by means of influencing the amplifier output signal. Every additional characteristic curve therefore is different in dependence upon the oxygen content of the blood. In contrast thereto, however, it is a significant characteristic of the present invention that specific control characteristics of a multiplicity of series-connected stages of an amplifier are all adjusted to one common characteristic. This characteristic is not the characteristic of an output signal, but is a control characteristic. Thus, the influencing does not result in the output signal, but in the control range of the amplifier itself. No additional characteristic curves result and whose deviations from the standard characteristic curve of all stages provide a measurement for a specific quantity to be measured. Aside from the different fields of use, the two subjects therefore also differ fundamentally as to the posing of an objective and its resolution.

In an advantageous embodiment of the invention, the control characteristic curves of the amplifier elements of all amplification stages can be adjusted to a joint control characteristic curve, which can be arbitrarily prescribed externally by means of correspondingly formed secondary control voltages. In an additional advantageous embodiment of the invention, if at least one of the amplifier elements exhibits the already preferred control characteristic curve within the amplifier chain, the remaining amplifier elements with their control characteristic can be adjusted to the preferred control characteristic curve.

DESCRIPTION OF THE PREFERRED EMBODIMENTS

Figure 1:
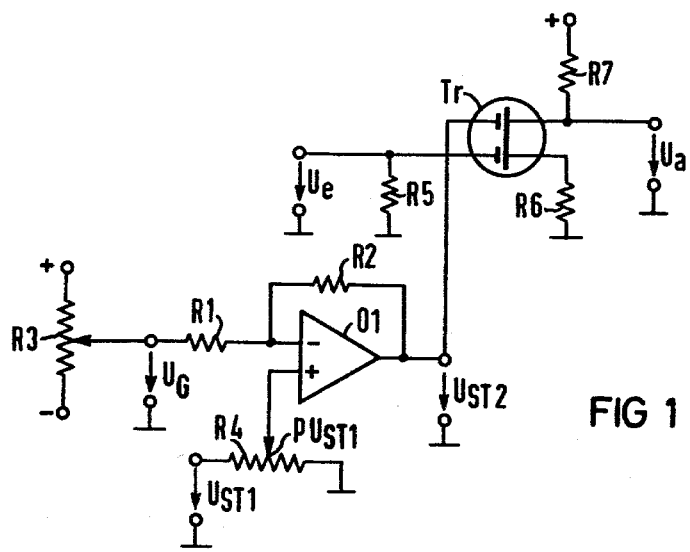
FIG. 1 illustrates the essential components of an individual amplification stage of a total chain with a control signal forming element in a first embodiment according to the invention.

In FIG. 1, one control signal forming element comprises an operational amplifier 01 having a first input resistance R1 and a negative feedback coupling resistance R2 at the inverted input. A DC voltage $U_G$ is connected at the input side of resistance R1, said DC voltage being variable within specific limits by use of an input potentiometer R3 which is connected in a floating manner to a DC voltage. Resistance R3 has a low resistance in order to avoid influences upon the amplification. This resistance advantageously amounts to 1/10 of the resistance value R1. At the non-inverting input of the operational amplifier 01 is connected the divider tap of a resistance potentiometer R4. R4 again is advantageously of low resistance, i.e. is to also lie in the range of R1/10, for example. The primary control voltage $U_{ST1}$ is connected to the resistance potentiometer R4. The respectively tapped partial voltage has the value of $p\, U_{ST1}$, whereby p can be varied within the limits of $0 \leq p \leq 1$. The voltage $U_{ST2}$ occurring at the output of the operational amplifier 01 is the secondary control voltage for the voltage control input of an active amplifier element Tr of an arbitrary amplification stage in a control amplifier (in ultrasonic equipment it is a depth compensation amplifier). In the present case, the active amplifier element Tr is specifically a dual-gate-Mosfet (DGM). However, it can also be, also for example, a bipolar transistor or a controllable amplifier tube or such. The DGM transistor Tr is equipped with circuit resistances R5, R6 and R7. The input signal to be amplified is referenced $U_e$. The amplified output signal is referenced $U_a$.

The secondary control voltage $U_{ST2}$ results with the forming element of FIG. 1 in dependence upon the primary control voltage $U_{ST1}$, the DC voltage $U_G$, and the resistance circuitry as follows:

$$U_{ST2} = p\, U_{ST1} \left(1 + \frac{R2}{R1}\right) - \frac{R2}{R1} U_G.$$

With the equation $$U_{ST2} = m U_{ST1} + n$$

m and n are:

$$m = p \left(1 + \frac{R2}{R1}\right)$$
$$n = -\frac{R2}{R1} U_G.$$

It is readily obvious that by a corresponding selection of resistances R2 and R1, a maximum value of an alteration of the rise of the control characteristics is determined from their ratio. By altering the factor p within the limits $0 \leq p \leq 1$ at the resistance potentiometer R4, the value of m can then be varied between this maximum value and a minimum value (zero). A parallel displacement of the control characteristic results by altering the forming magnitude n when difference DC voltages $U_G$ are set with the aid of potentiometer R3.

In the embodiment of FIG. 1 a particular simplification results if R1=R2 is established. From this results the equation $$U_{ST2} = 2pU_{ST1} - U_G.$$

There lies the variation range of the characteristics within the limits of 0 through 2. The forming magnitude n results directly from the magnitude of the selected DC voltage $U_G$.

Figure 2:
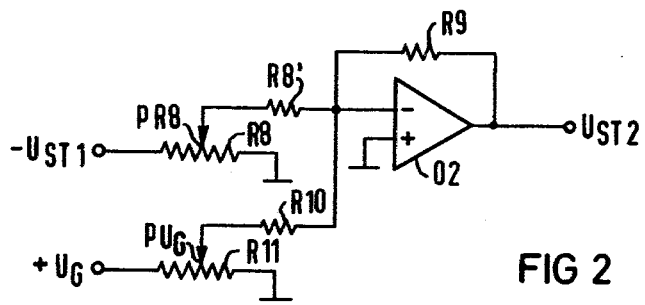
FIG. 2 illustrates a control signal forming element in another embodiment of the invention.

A modification of the forming element results according to FIG. 2. The correlation between primary control voltage $U_{ST1}$ and secondary control voltage $U_{ST2}$ is with this circuit as follows:

$$U_{ST2} = p\frac{R9}{R8'} U_{ST1} - q\frac{R9}{R10} U_G, \frac{R9}{R8'} > 1.$$

The forming magnitude m and n are here provided as $$m = p\frac{R9}{R8'}$$
$$n = -q\frac{R9}{R10} U_G.$$

For both embodiments it is recommended to employ an additional field effect transistor with a series resistance in a temperature compensation circuit as a negative feedback resistance R2 or R9 for the compensation of temperature effects.

Thus, with the circuits mentioned, secondary control voltages $U_{SR2}$ can be connected for each transistor Tr in an amplification stage of an amplifier chain circuit, said secondary control voltages being linked with the primary control voltage $U_{ST1}$ by the equation $U_{ST2} = m \cdot U_{ST1} + n$. The forming magnitudes m and n can therefore be individually differently adjusted for each amplifier element in the control signal forming element along the lines that differences in the control characteristic courses $V(U_{ST})$ are compensated for by adjusting to a jointly prescribable characteristic.

Figure 3:
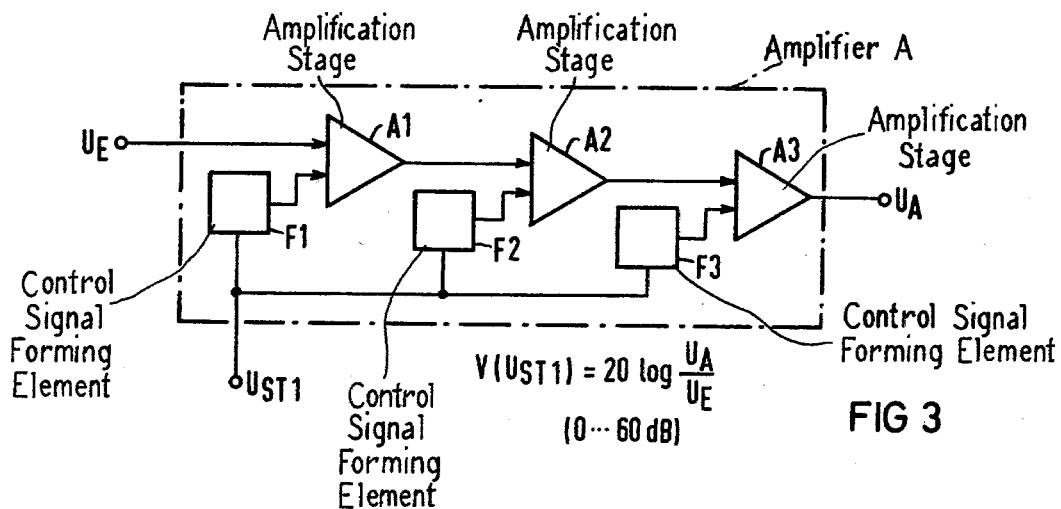
FIG. 3 illustrates a principal design of an amplifier having three amplification stages in addition to assigned control signal forming elements.

One embodiment for an amplifier A with three amplification stages A1, A2, A3 in chain circuitry, for example, is illustrated in the principal circuit diagram of FIG. 3. These amplification stages all exhibit the same control characteristic curve on the basis of a corresponding preselection of control signal forming magnitudes in the control signal forming elements F1, F2 and F3. With the aid of the primary control voltage $U_{ST1}$ common for all stages, the amplification, for example, can be varied in the range of zero through 60 dB, and the total amplification of the amplifier chain results as $$V(U_{ST1}) = 20 \log \frac{U_A}{U_E}.$$

Thus, for an amplification curve known across the total dynamic range, the original signal (input signal $U_E$) can be determined by the original curve from the outut signal $U_A$ by a corresponding recomputation. Thus, the amplifier according to FIGS. 1 through 3 facilitates a numeric evaluation in the initially described manner.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. An amplifier for electrical signals, comprising: a plurality of series-connected amplification stages of which each has at least one voltage-controlled amplifier element having means for setting its control characteristic by a control voltage; a control signal forming means for at least each of the amplifier elements of each amplification stage which have different control characteristics compared to one another; said control signal forming means forming a secondary control voltage $U_{ST2}$ from a primary control voltage $U_{ST1}$ connected at an input side of the control signal forming means, said secondary control voltage being determined according to the equation $$U_{ST2} = mU_{ST1} + n$$

where m and n represent forming magnitudes; each of said control signal forming means individually differently adjusting the forming magnitudes for each amplifier element such that differences in said different control characteristics can be compensated for by adjusting to a commonly prescribable preferred characteristic, the control signal forming means having a voltage divider means for determining the forming magnitude m and means for superimposing a DC voltage with a product signal of $m \cdot U_{ST1}$ in order to prescribe the forming magnitude n.

2. An amplifier according to claim 1 in which the control characteristic for each of the amplifier elements of all the amplification stages is adjusted by the secondary control voltages through connection of the secondary control voltages to said means for setting.

3. An amplifier according to claim 1, characterized in that the primary control voltage ($U_{ST1}$) is connected to be the same for all amplification stages.

4. An amplifier for electrical signals, comprising: a plurality of series-connected amplification stages of which each has at least one voltage-controlled amplifier element having means for setting its control characteristic by a control voltage; a control signal forming means for at least each of the amplifier elements of each amplification stage which have different control characteristics compared to aone another; said control signal forming means forming a secondary control voltage $U_{ST2}$ from a primary control voltage $U_{ST1}$ connected at an input side of the control signal forming means, said secondary control voltage being determined according to the equation $$U_{ST2} = mU_{ST1} + n$$

where m and n represent forming magnitudes; each of said control signal forming means having forming magnitude means for individually differently adjusting the forming magnitudes for each amplifier element such that differences in said different control characteristics can be compensated for by adjusting to a commonly prescribable preferred characteristic; and the control signal forming means having forming magnitude means comprising an operational amplifier with a first input resistance and a negative feedback resistance connected thereto, and an adjustable voltage divider connected to an input of the operational amplifier, said forming magnitude means determining a maximum value of m from a ratio of the feedback resistance to the input resistance and determining a value of m between the maximum value and a minimum value by adjustment of the voltage divider.

5. An amplifier according to claim 4 in which the operational amplifier is additionally influenced by a DC voltage means at an input side for setting n.

6. An amplifier according to claim 4 in which the adjustable voltage divider is connected to modify the primary voltage ($U_{ST1}$) by a factor of p ($0 \leq p \leq 1$) to determine the value of m between the maximum value and the minimum value.

7. An amplifier for electrical signals comprising:
(a) a plurality of series-connected amplifier states, each amplifier stage having a voltage-controlled amplifier element with control characteristic setting means;
(b) at least two of the voltage-controlled amplifier elements having their control characteristic setting means each connecting to a respective control signal forming means;
(c) a primary control voltage $U_{ST1}$ connected to each control signal forming means; and
(d) each of said control signal forming means creating a secondary control voltage $U_{ST2}$ at its output according to the equation $U_{ST2} = m\ U_{ST1} + n$ where m is an adjustable forming magnitude adjusted by a voltage divider and n is an adjustable forming magnitude established by superimposing a DC voltage on $m \cdot U_{ST1}$.

8. The amplifier of claim 7 wherein each control signal forming means comprises an operational amplifier having a negative feedback resistance, an input resistance, a variable resistance between the primary control voltage and an input of the operational amplifier, and a variable DC voltage applied to an input of the operational amplifier.

* * * * *